US009024456B2

(12) United States Patent
Yang et al.

(10) Patent No.: US 9,024,456 B2
(45) Date of Patent: May 5, 2015

(54) PHOTOLITHOGRAPHY ALIGNMENT MARK, MASK AND SEMICONDUCTOR WAFER CONTAINING THE SAME MARK

(75) Inventors: Xiaosong Yang, Beijing (CN); Yibo Yan, Beijing (CN); Tzu Hsuan Lu, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 13/329,152

(22) Filed: Dec. 16, 2011

(65) Prior Publication Data

US 2013/0075938 A1 Mar. 28, 2013

(30) Foreign Application Priority Data

Sep. 23, 2011 (CN) .......................... 2011 1 0285659

(51) Int. Cl.
*H01L 23/544* (2006.01)
*G03F 1/42* (2012.01)

(52) U.S. Cl.
CPC ............... *G03F 1/42* (2013.01); *H01L 23/544* (2013.01); *H01L 2223/5442* (2013.01); *H01L 2223/54426* (2013.01); *H01L 2223/54453* (2013.01)

(58) Field of Classification Search
CPC .................. H01L 23/544; H01L 2223/54453; H01L 2223/5442; G03F 9/7076
USPC .......................................... 257/797, E23.179
See application file for complete search history.

(56) References Cited

U.S. PATENT DOCUMENTS

| | | | |
|---|---|---|---|
| 5,216,257 A | 6/1993 | Brueck et al. | |
| 6,037,671 A | 3/2000 | Kepler et al. | |
| 6,486,954 B1 | 11/2002 | Mieher et al. | |
| 2003/0223630 A1 | 12/2003 | Adel et al. | |
| 2005/0286052 A1* | 12/2005 | Huggins et al. | 356/401 |
| 2009/0040536 A1 | 2/2009 | Chiu et al. | |
| 2009/0225331 A1 | 9/2009 | Van Haren | |
| 2010/0207284 A1 | 8/2010 | Holloway et al. | |
| 2011/0309532 A1* | 12/2011 | Brenna | 257/797 |

FOREIGN PATENT DOCUMENTS

| | | |
|---|---|---|
| CN | 101526757 | 9/2009 |
| WO | WO 2009002716 | 12/2008 |

OTHER PUBLICATIONS

Office Action from corresponding Chinese Patent Appl. No. 201110285659.2, dated May 4, 2014.
Second Office Action from corresponding Chinese Patent Appl. No. 201110285659.2, dated Sep. 29, 2014, in Chinese language, listing cited references.

* cited by examiner

*Primary Examiner* — Hoa B Trinh
(74) *Attorney, Agent, or Firm* — Koppel, Patrick, Heybl & Philpott; Michael J. Ram (57) ABSTRACT

A photolithography alignment mark and a mask and semiconductor wafer containing said mark are described. The alignment mark comprises: a plurality of first alignment lines arranged parallel with each other in a first direction; a plurality of second alignment lines arranged parallel with each other in a second direction perpendicular to the first direction, and wherein each of the plurality of first alignment lines is composed of a predetermined number of first fine alignment lines uniformly spaced from each other, and each of the plurality of second alignment lines is composed of a predetermined number of second fine alignment lines uniformly spaced from each other. Alignment marks can be located in non-circuit pattern regions of the mask and on a plurality of layers in mark regions on the wafer.

30 Claims, 7 Drawing Sheets

PHOTOLITHOGRAPHY ALIGNMENT MARK, MASK AND SEMICONDUCTOR WAFER CONTAINING THE SAME MARK

CROSS-REFERENCE TO RELATED APPLICATIONS

This application claims priority to Chinese Patent Application No. 201110285659.2, filed on Sep. 23, 2011 and entitled "Photolithography Alignment Mark, Mask and Semiconductor Wafer Containing the Same Mark", which is incorporated herein in its entirety by reference.

BACKGROUND OF THE INVENTION

1. Field of the Invention

The present invention relates to the field of manufacturing semiconductor device, and particularly, to an alignment mark employed in a photolithography process and methods of positioning the alignment mark on a mask and a semiconductor wafer.

2. Description of the Related Art

Photolithography, a key technique of large-scaled integrated circuit manufacturing, determines largely how integrated an integrated circuit can be. Photolithography refers to transferring through exposure a mask pattern to a wafer coated with a photoresist, such that the mask pattern will appear on the wafer after development.

A key step in photolithography is alignment of the mask and the wafer. In the manufacture of integrated circuits, it is commonly required to expose multiple layers of mask patterns on a wafer to form a complete circuit structure. In such a multi-photolithography process, with respect to each of the photolithography processes subsequent to the first one, it is necessary to accurately align the mask to be employed in a respective photolithography process with a first layer of a pattern or one of the several previous layers of the pattern exposed on the wafer before proceeding with the respective subsequent photolithography process. The complexity and functional density of the resulting integrated circuits are determined by the accurate registration of various photolithography masks.

At present, two kinds of alignment modes are mainly being used in a photolithography process, namely, zero mark alignment and scribe lane mark alignment. In zero mark alignment, generally only a first layer of pattern has an alignment mark such as XPA (extended primary mark) disposed therein all other subsequent layers are aligned with the first layer. The zero mark is commonly formed on a margin region of the pattern.

However, in devices with a multilayer circuit structure, the signal intensity of a zero mark is usually deteriorated significantly by subsequent metal or passivation layers, leading to difficulty in accurate alignment. In order to overcome such a problem in the prior art, extra photolithography or etching processes need to be applied to reveal the alignment mark regions. However, these extra processes can increase cost and processing time, as a result reducing productivity.

In scribe lane mark alignment, an alignment mark, such as bar type SPM (scribe lane primary mask), is formed in the scribe lanes of each layer or several layers. A pattern layer can be aligned with the alignment mark from one of previous layers.

Nevertheless, with the limitations of photolithography equipment and processes per se, a scribe lane alignment mark such as SPM generally has a constant dimension, such as 80 µm. In order to improve gross dies on a wafer, it is desirable to have the size of scribe lanes less than 80 µm, such as 72 µm, or even 60 µm. In this situation, common SPM alignment marks cannot be accommodated in such small scribe lanes.

Therefore, it is desired to provide a photolithography alignment approach which is applicable to wafers with small sized scribe lanes with high registration accuracy.

SUMMARY

The present method is proposed to eliminate or at least partially alleviate some or all of the above problems of the prior art.

The procedure described herein, provides a novel photolithography alignment mark formed in the marginal mask regions of multiple pattern layers on a wafer. Lines in the alignment mark are further subdivided such that the alignment mark is applicable to wafers with small sized scribe lanes with high alignment accuracy.

According to a first aspect of the present disclosure, a photolithography alignment mark comprises a plurality of first alignment lines arranged in parallel with each other in a first direction; a plurality of second alignment lines arranged in parallel with each other in a second direction perpendicular to the first direction, wherein each of the plurality of the first alignment lines is composed of a predetermined number of first fine alignment lines uniformly spaced from each other, and each of the plurality of the second alignment lines is composed of a predetermined number of second fine alignment lines uniformly spaced from each other.

In one embodiment, the predetermined number of fine alignment lines is 3.

In a second embodiment, the predetermined number of fine alignment lines is 2.

In a third embodiment, the predetermined number of fine alignment lines is 4.

In one embodiment, a width of the first fine alignment line is equal to a width of a space between any two adjacent first fine alignment lines and a width of the second fine alignment line is equal to a width of a space between any two adjacent second fine alignment lines.

In a further embodiment, the width of the first alignment line is 8 µm, and the width of the second alignment line is 8 µm.

In one embodiment, the plurality of the first alignment lines are uniformly spaced apart, and the plurality of second alignment lines are uniformly spaced apart.

In one embodiment, the width of the space between any two adjacent first alignment lines is equal to the width of the space between any two adjacent second alignment lines.

In one embodiment, both the space between any two adjacent first alignment lines and the space between any two adjacent second alignment lines have a width of 8 µm or 9.6 µm.

In one embodiment, the space between any two adjacent first alignment lines has a width different from that of the space between any two adjacent second alignment lines.

In one embodiment, the spaces between any two adjacent first alignment lines has a width of 8 µm and the space between any two adjacent second alignment lines has a width of 9.6 µm.

In one embodiment, the plurality of the first alignment lines is grouped into two sets, wherein the first alignment lines in each set are uniformly spaced and the space between any two adjacent first alignment lines in the first set has a width different from that of the space between any two adjacent first alignment lines in the second set.

In one embodiment, the space between any two adjacent first alignment lines in the first set the space between any two adjacent first alignment lines in the second set has a different width of 8 µm and a width of 9.6 µm, respectively.

In one embodiment, the plurality of the second alignment lines is grouped into two sets, wherein the second alignment lines in each set are uniformly spaced and the space between any two adjacent second alignment lines in the first set has a width different from that of the space between any two adjacent second alignment lines in the second set.

In one embodiment, the space between any two adjacent second alignment lines in a first set is 8 µm and the space between any two adjacent second alignment lines in a second set has a width of 9.6 µm.

In one embodiment, the first fine alignment lines and the second fine alignment lines are made of a metal, and the space between any two adjacent first fine alignment lines and the space between any two adjacent second fine alignment lines are made of an oxide, the space between any two adjacent first alignment lines and the space between any two adjacent second alignment lines is also an oxide.

In one embodiment, the first fine alignment lines and the second fine alignment lines are made of an oxide, and the space between any two adjacent first fine alignment lines and the space between any two adjacent second fine alignment lines are made of a metal, the space between any two adjacent first alignment lines and the space between any two adjacent second alignment lines are also made of a metal as well.

According to a second aspect: mask is provided comprising a central region having a mask pattern corresponding to a circuit pattern to be formed; and a marginal region having one or more photolithography alignment marks as set forth in the first aspect of this.

According to a third aspect a semiconductor wafer comprise a plurality of wafer layers, each of the wafer layers comprising a primary wafer region for forming a required circuit pattern and a mark region for accommodating one or more photolithography alignment marks according to the first aspect hereof, wherein the photolithography alignment marks are positioned in the mark regions of one or more selected layers of the plurality of wafer layers.

In one embodiment, the mark region is located in one or more corners of the wafer layer.

In one embodiment, the mark region comprises a plurality of mark sub-regions, each of which is used to accommodate one or more said photolithography alignment marks, wherein at least two corners of the wafer layer have a mark sub-region provided therein.

In one embodiment, the mark region comprises a first mark sub-region and a second mark sub-region, wherein the first mark sub-region and the second mark sub-region are located in a lower-left corner and a upper-right corner of the wafer layer, respectively.

In one embodiment, the mark region comprises a first mark sub-region and a second mark sub-region, wherein the first mark sub-region and the second mark sub-region are located in a lower-right corner and a upper-left corner of the wafer layer, respectively.

In one embodiment, the plurality of wafer layers comprise one or more metal layers, wherein the photolithography alignment mark is formed in one or more of the mark regions of the one or more metal layers.

In one embodiment, the plurality of wafer layers further comprise an active area layer, a poly-Si gate layer, a contact layer and a passivation layer, wherein the photolithography alignment marks are formed in the mark regions of the active area layer, the contact layer and the passivation layer.

In one embodiment, the photolithography alignment mark is formed in the mark region of the poly-Si gate layer.

In one embodiment, when there are multiple selected layers, the positions of the photolithography alignment marks in the mark regions of the different selected layers are staggered.

In one embodiment, the positions of the photolithography alignment marks in adjacent selected layers are separated from each other by 1 mm.

In one embodiment, when there are multiple selected layers, the photolithography alignment marks composed of lines made of metal and the photolithography alignment marks composed of lines made of oxide are alternated, on layer-by-layer basis, and are formed in the mark regions of the selected layers, such that the positions of the photolithography alignment marks in the mark regions of the different selected layers overlap.

According to a fourth aspect provided, is semiconductor wafer, comprising: an active area layer, a poly-Si gate layer, a contact layer, a first metal layer, a first via layer, a second metal layer, a second via layer, a third metal layer, a third via layer, a fourth metal layer, a fourth via layer, a fifth metal layer, a top via layer, a top metal layer, a passivation layer and an aluminum pad layer wherein the photolithography alignment marks according to the first aspect herein are formed in the active area layer, the contact layer, the first metal layer, the fourth metal layer and the passivation layer.

In one embodiment, the photolithography alignment marks are further formed at least one of the poly-Si gate layer, the second metal layer, the third metal layer, the fifth metal layer and the top metal layer.

The photolithography alignment marks of the disclosed embodiments are formed in marginal regions of each of or several of the pattern layers on a wafer. Lines in the alignment marks are further subdivided, such that the alignment marks re applicable to wafers with small sized scribe lanes with high alignment accuracy.

The photolithography alignment marks of the disclosed embodiments can be located in non-circuit pattern regions of a mask, and are used only for processing wafers having small sized scribe lanes without interfering with wafer processing and without causing any additional mask costs.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention. The same reference labels in various drawings will refer to the same parts or steps.

The present invention can be more clearly understood from the following detailed description with reference to the drawings, wherein.

DESCRIPTION OF THE EMBODIMENTS

Various exemplary embodiments of the present invention will now be described in detail with reference to the drawings. The relative arrangement of the components and steps, the numerical expressions and numerical values set forth in these embodiments do not limit the scope of the present invention unless it is specifically stated otherwise.

For the convenience of description, various parts shown in the figures are not illustrated to scale or according to actual proportions.

The following description of exemplary embodiments are merely illustrative in nature and are not intended to limit the invention, its application or its uses.

Techniques, methods and apparatus known by one of ordinary skill in the relevant art may not be discussed in detail but are intended to be part of the present description where appropriate.

In all of the examples illustrated and discussed herein, any specific values are illustrative only and non-limiting. Thus, other examples of the exemplary embodiments could have different values.

Similar reference numerals and letters refer to similar items in the following figures; thus once an item is defined in one figure, it is possible that it need not be further discussed in the following figures.

In order to achieve highly accurate photolithography alignment for small sized scribe lanes, one embodiment of the disclosure provides an improved zero photolithography alignment mark formed in marginal mark regions of one or more of pattern layers on a wafer, wherein each alignment line of the alignment mark is composed of multiple fine lines.

Figure 1A:
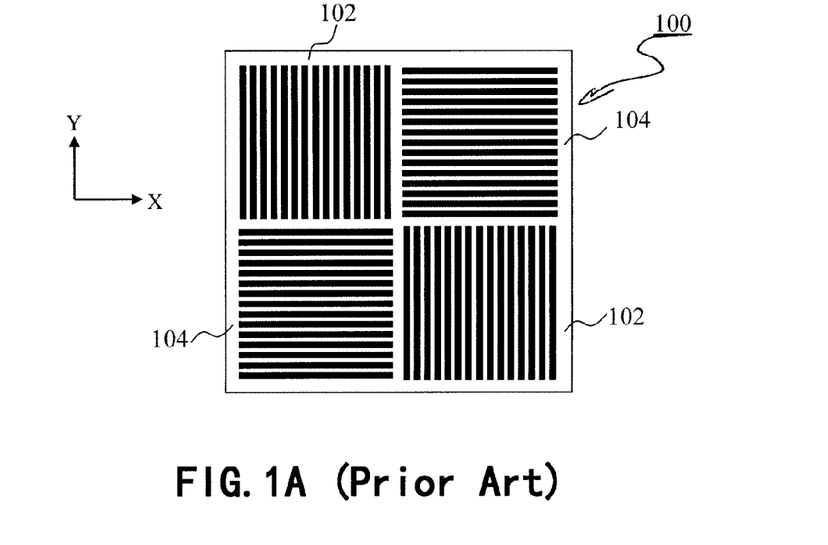
FIGS. 1A to 1C are schematic diagrams showing a prior art XPA-00 photolithography alignment mark.
Figure 1B:
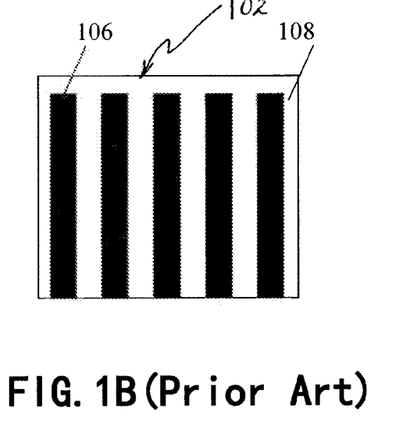
Figure 1C:
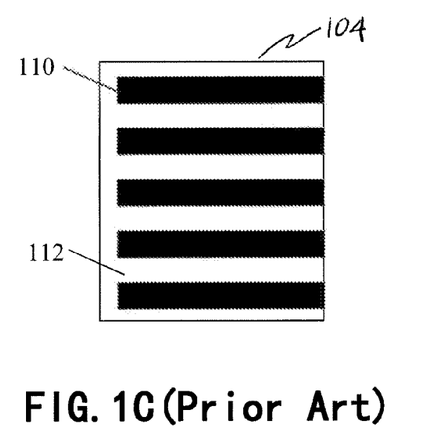

FIGS. 1A to 1C show an example of a prior art alignment mark, a standard XPA alignment mark, also called an XPA-00 alignment mark. As shown in FIG. 1A, the photolithography alignment mark 100 is composed of four groups of alignment lines in a square, that is, two sets 102 of first alignment lines arranged in a Y direction and two sets 104 of second alignment lines arranged in an X direction are alternately arranged to form a square to achieve alignment in the X and Y directions respectively, wherein the X direction is perpendicular to the Y direction.

As shown in FIG. 1B, an enlarged portion of the first set of alignment lines 102 is composed of a plurality of first alignment lines 106 and a plurality of first alignment line spaces 108 for uniformly separating first alignment lines 106 from each other, all arranged in parallel in the Y direction. Similarly, as shown in FIG. 1C an enlarged portion of the second set of alignment lines 104 is composed of a plurality of second alignment lines 110 and a plurality of second alignment line spaces 112 for uniformly separating the second alignment lines 110 from each other, all arranged in parallel in the X direction.

In contrast to the prior art alignment mark as shown in FIGS. 1A to 1C, an improved alignment mark is provided in an embodiment of the disclosure, referred to as an XPA-MN alignment mark 200, and will be described in detail with reference to FIGS. 2A to 2H.

Figure 2A:
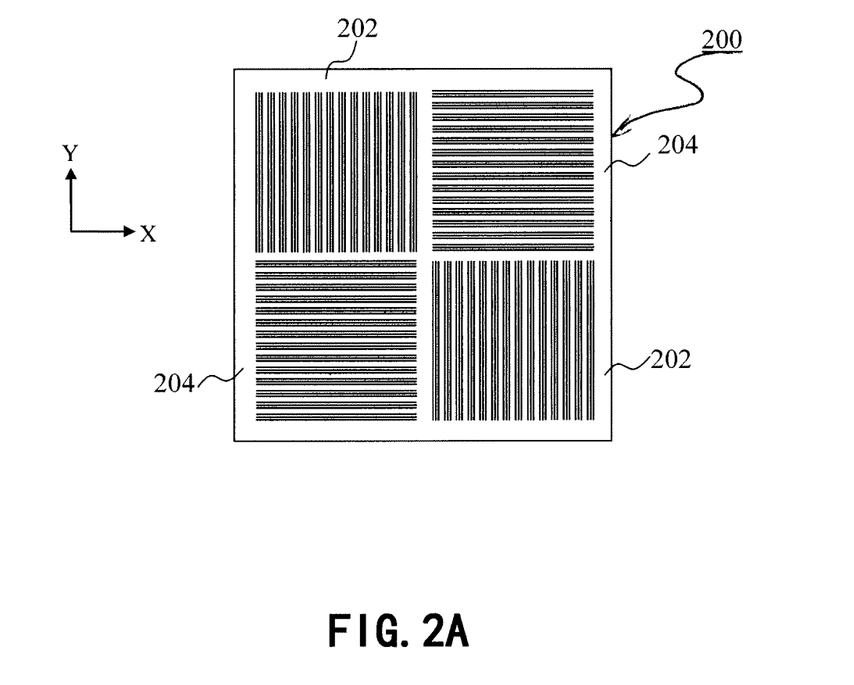
FIGS. 2A to 2E are schematic diagrams showing an XPA-53 photolithography alignment mark according to the embodiments of the disclosure.

Similar to the alignment mark 100 shown in FIG. 1, the photolithography alignment mark 200, shown in the embodiments of FIG. 2, is composed of two sets 202 of first alignment lines arranged in the Y direction and two sets 204 of second alignment lines arranged in the X direction, said sets of lines are alternately arranged in a square, as shown in FIG. 2A. While the alignment mark in this embodiment has two sets of alignment lines along each of the X and Y directions and the four sets of alignment lines are alternately arranged in a square, in other embodiments, it is possible for the alignment mark to have one or more sets of alignment lines in each of the X and Y directions and the arrangement of the multiple sets of alignment lines is not limited to a square as shown in FIG. 2A.

Figure 2B:
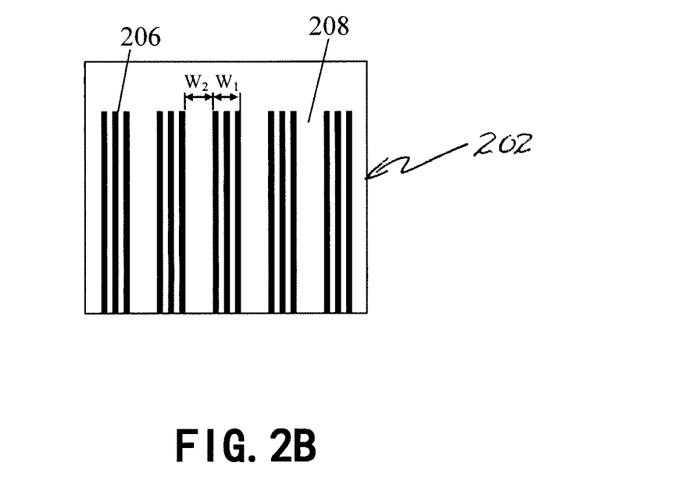
Figure 2C:
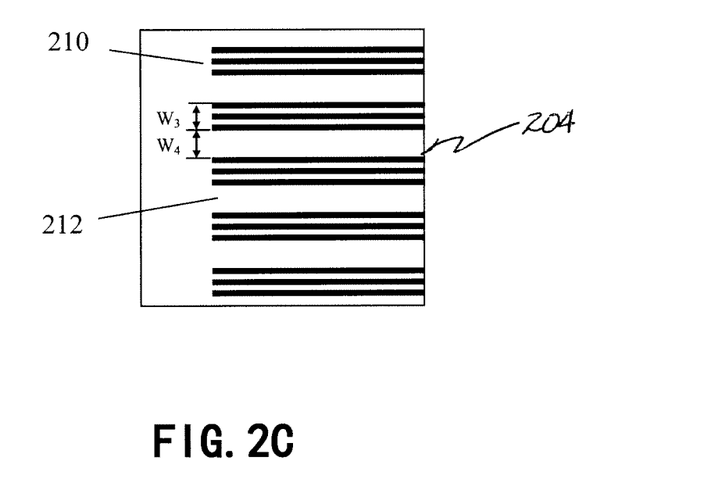
Figure 2D:
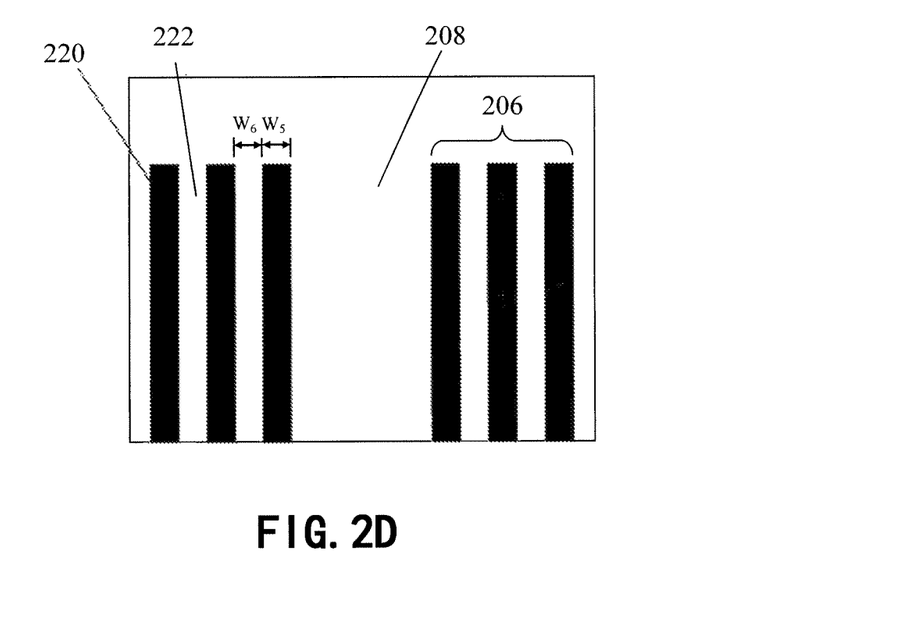
Figure 2E:
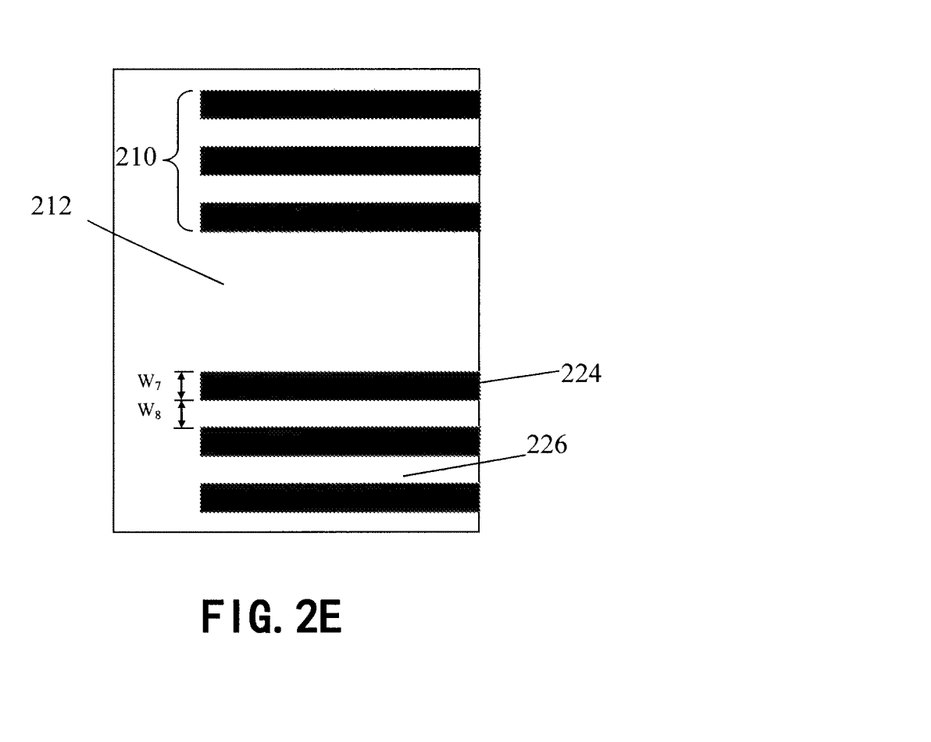

FIGS. 2B and 2C are enlarged diagrams showing portions of the first set 202 of alignment lines and the second set 204 of alignment lines in a photolithography alignment mark 200 as shown in FIG. 2A. FIGS. 2D and 2E are enlarged diagrams further showing the portion of the first set 202 of alignment lines and the portion of the second set 204 of alignment lines.

FIG. 2B is an enlarged diagram, the first set 202 of alignment lines and is composed of a plurality of first alignment lines 206 and first alignment line spaces 208 and uniformly separating the first alignment lines 206 from each other, and arranged in parallel in the Y direction. Similarly, as shown in FIG. 2C the enlarged diagram of the second set 204 of alignment lines is composed of a plurality of second alignment lines 210 and second alignment line spaces 212, uniformly separate second alignment lines 210 from each other, and arranged in parallel in the X direction. In one embodiment, as shown in FIGS. 2B and 2C the further enlarged diagrams show a first alignment line 206 having a width $W_1$ which is equal to a width $W_3$ of the second alignment line 210, both of which can be 8 μm.

Unlike the prior art alignment mark XPA-00 shown in FIGS. 1A to 1C, in the alignment mark XPA-MN of the disclosed embodiments as shown in FIGS. 2A to 2H, the first alignment lines 206 are subdivided into a plurality of fine alignment lines, that is, each of the first alignment lines 206 are composed of a first predetermined number (N) of first fine alignment lines 220 and a second predetermined number (M-N) of the first fine alignment line spaces 222 uniformly separating first fine alignment lines 220 from each other, as shown in the enlarged diagrams of FIGS. 2B and 2D. Similarly, each of the second alignment lines 210 are also subdivided in the same manner, such that, each of the second alignment lines 210 are composed of a first predetermined number (N) of the second fine alignment lines 224 and a second predetermined number (M-N) of the second fine alignment line spaces 226 uniformly separating second fine alignment lines 224 from each other, as shown in the enlarged diagrams of FIGS. 2C and 2E.

In one embodiment, a width $W_5$ of a first fine alignment line 220 is equal to a width $W_6$ of a first fine alignment line space 222, and a width $W_7$ of a second fine alignment line 224 is equal to a width $W_8$ of a second fine alignment line space 226. In this situation, $W_5=W_6=W_1/M$, and $W_7=W_8=W_3/M$.

FIGS. 2B to 2E show an alignment mark with M=5 and N=3, namely, XPA-53. Each of the first alignment lines 206 are composed of three first fine alignment lines 220 and two first fine alignment line spaces 222; and each of the second alignment lines 210 are composed of three second fine alignment lines 224 and two second fine alignment line spaces 226. In the embodiments in which the width $W_1$ of the first alignment line 206 and the width $W_3$ of the second alignment line 210 are both 8 μm, if the width $W_5$ of the first fine alignment line 220 is equal to width $W_6$ of the first fine alignment line space 222, then $W_5=W_6=(8/5)$μm (1.6 μm); if the width $W_7$ of second fine alignment line 224 is equal to the width $W_8$ of second fine alignment line space 226, then $W_7=W_8=(8/5)$μm (1.6 μm).

Figure 2F:
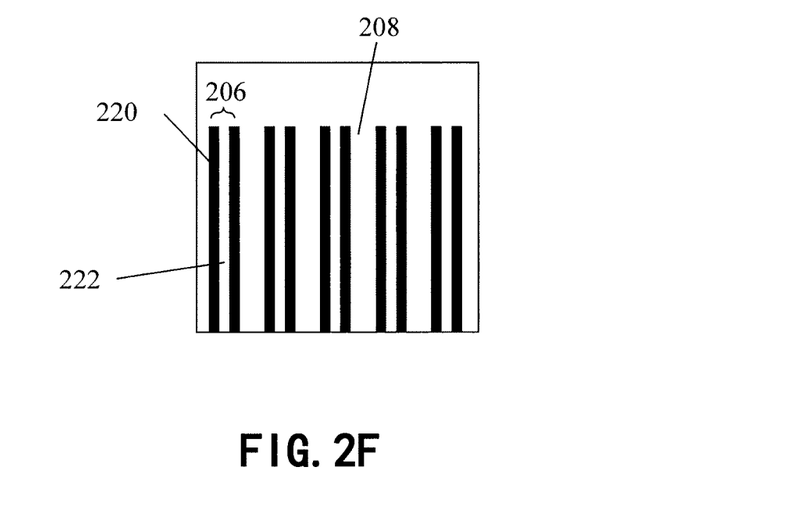
FIG. 2F is an enlarged schematic diagram showing an XPA-32 photolithography alignment mark according to the embodiments of the disclosure.

However, other XPA-MN alignment marks subdivided in other manners are also possible. In a XPA-32 alignment mark as shown in FIG. 2F, each of the first alignment lines 206 are composed of two first fine alignment lines 220 and one first fine alignment line space 222. In the embodiments in which the width of the first alignment line 206 is 8 μm, the first fine alignment line 220 and the first fine alignment line space 222 both have a width of $(8/3)$μm (2.67 μm). Second alignment line 210 can be subdivided in a similar manner. However, that subdivision is not described in detail and not illustrated in FIG. 2F.

Figure 2G:
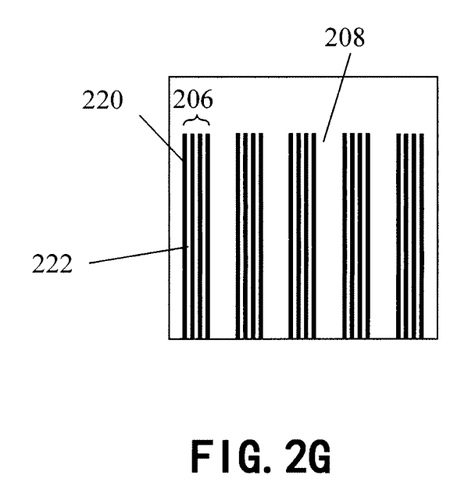
FIG. 2G is an enlarged schematic diagram showing an XPA-74 photolithography alignment mark according to the embodiments of the disclosure.

In addition, as shown in FIG. 2G, in an XPA-74 alignment mark, each of the first alignment lines 206 are composed of four first fine alignment lines 220 and three first fine alignment line spaces 222. If the width of the first alignment line 206 are 8 μm, the first fine alignment line 220 and the first fine alignment line space 222 both have a width of $(8/7)$μm (1.142 μm). The second alignment lines 210 can be subdivided in a similar manner but are not described in detail and not illustrated in FIG. 2G.

As compared to the prior art XPA-00 photolithography alignment mark, the XPA-MN photolithography alignment marks disclosed herein and shown in FIGS. 2A to 2G have thinner alignment lines, enabling higher registration accuracy in the X and Y directions. Furthermore, it has been found by the inventors that, as for the Cu Back End of Line (BEOL) process, as compared to an XPA-32 alignment mark shown in FIG. 2F and XPA-74 alignment mark shown in FIG. 2G, the XPA-53 alignment mark shown in FIGS. 2B to 2E has optimal registration accuracy. While the XPA-MN alignment marks of this invention are described using XPA-53, XPA-32 and XPA-74 as examples, those of ordinary skill in the art will understand based on the teachings herein that alignment marks in other division manners are also applicable depending on specific process flows.

In some embodiments, depending upon specific process requirements, the width $W_2$ of the first alignment line space 208 may be equal to the width $W_4$ of the second alignment line space 212, for example, both can be 8 μm or 9.6 μm. In other embodiments, the width $W_2$ of the first alignment line space 208 may be different from the width $W_4$ of the second alignment line space 212, for example, $W_2=8$ μm while $W_4=9.6$ μm and vice versa.

In some embodiments, depending upon specific process requirements, the first alignment line spaces 208 in the two sets 202 of first alignment lines shown in FIG. 2A may have different widths $W_2$. For example, one first alignment line space 208 in the first set 202 of alignment lines in the upper-left corner has a width $W_2$ of 8 μm, while the first alignment line space 208 in the first set 202 of alignment lines in the lower-right corner has a width $W_2$ of 9.6 μm or vice versa. Similarly, the second alignment line spaces 212 in the two sets 204 of second alignment lines as shown in FIG. 2A may have different widths $W_2$, for example, widths of 8 μm and 9.64 μm respectively.

Figure 2H:
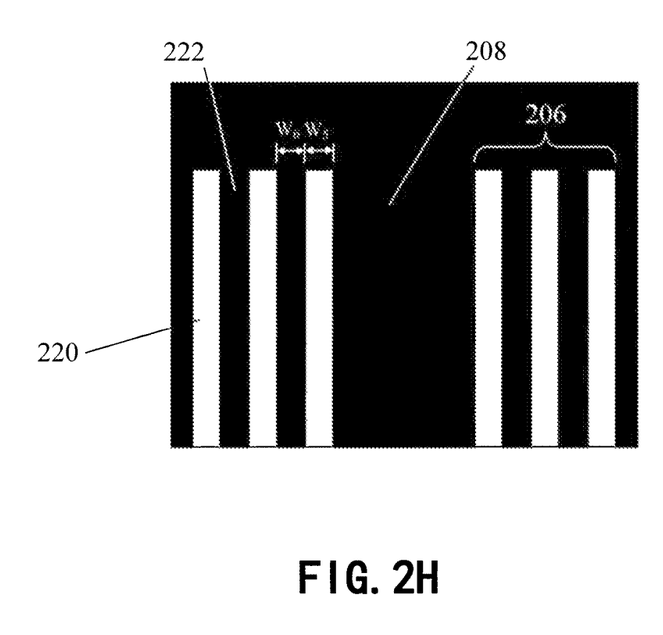
FIG. 2H is an enlarged schematic diagram showing a reverse-tone XPA-53 photolithography alignment mark according to the embodiments of the disclosure.

In some embodiments, the first fine alignment lines 220 and the second fine alignment lines 224, shown in FIGS. 2B to 2G may be made of a metal, while the first fine alignment line spaces 222, the second fine alignment line spaces 226, the first alignment line spaces 208 and the second alignment line spaces 212 may be made of an oxide. However, in other embodiments, first fine alignment lines 220 and second fine alignment lines 224 may be made of an oxide, while first fine alignment line spaces 222, second fine alignment line spaces 226, first alignment line spaces 208 and second alignment line spaces 212 can be made of a metal, as shown in FIG. 2H, which is referred to herein as "reverse-tone" alignment marks, as opposed to the "positive-tone" alignment marks shown in FIGS. 2B to 2G. The detailed description of how to employ a "reverse-tone" alignment mark is given below with reference to FIG. 4.

Figure 3:
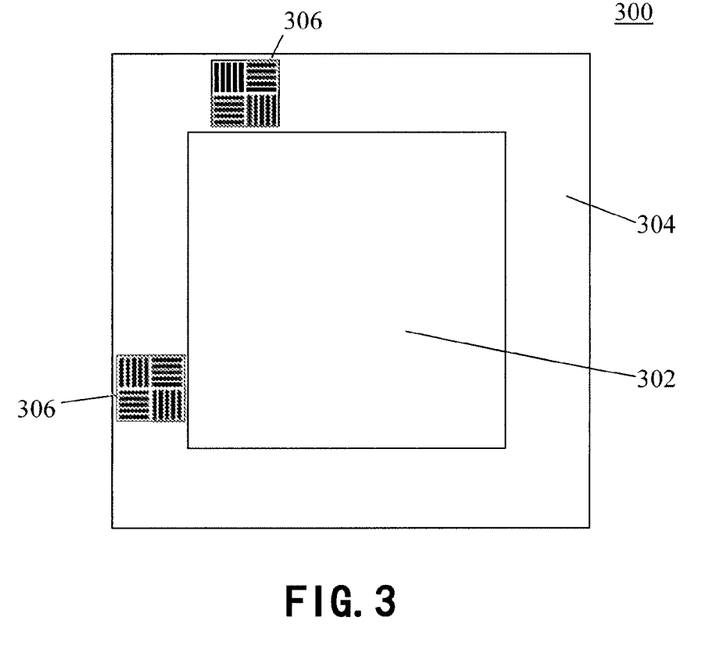
FIG. 3 is a schematic diagram showing a mask having alignment marks according to the embodiments of the disclosure.

A mask 300 having the photolithography alignment marks shown in FIGS. 2A to 2H is described with reference to FIG. 3. As shown in FIG. 3, mask 300 comprises a central region 302 and a marginal region 304. Central region 302 has a mask pattern corresponding to the circuit pattern to be formed on a wafer. Photolithography alignment marks 306 of the embodiments shown in FIGS. 2A to 2H are located in the marginal region 304 which comprise a non-circuit pattern region.

FIG. 3 only schematically illustrates a mask according to the disclosed embodiments. The central region, the marginal region of the mask and the photolithography alignment marks are not drawn to scale. In fact, the ratio of the sizes of photolithography alignment mark 306 and central region 302 is far less than shown herein.

In the case of the marginal region 304 of the mask having enough room, a plurality of photolithography alignment marks 306 can be applied. In some embodiments, these photolithography alignment marks can have different division aspects. For example, the mask 300 may have two types of alignment marks, such as XPA-53 and XPA-74, formed thereon, The marks to be employed for alignment are determined based on specific process requirements.

In practice, it is possible to the prepare photolithography alignment mark 306 as disclosed herein on the marginal region of the mask only if the photolithography alignment mark 306 is necessary, such as when processing wafers with small sized scribe lanes.

A semiconductor wafer 400 with the photolithography alignment mark as shown in FIG. 2A to 2H is described with reference to FIG. 4. A semiconductor wafer 400 generally comprises multiple wafer layers generally designed from 1 to i, wherein i is an integer larger than 1, the multiple wafer layers are referred to herein collectively as 402 unless a specific wafer layer is described. Each wafer layer 402 comprises a primary chip region 404 and mark region 406. The primary chip region 404 will have a designed circuit pattern thereon after exposure and development. The mark region 406 can be used to accommodate one or more photolithography alignment marks 410, such as photolithography alignment mark 200 shown in FIGS. 2A to 2H.

Figure 4:
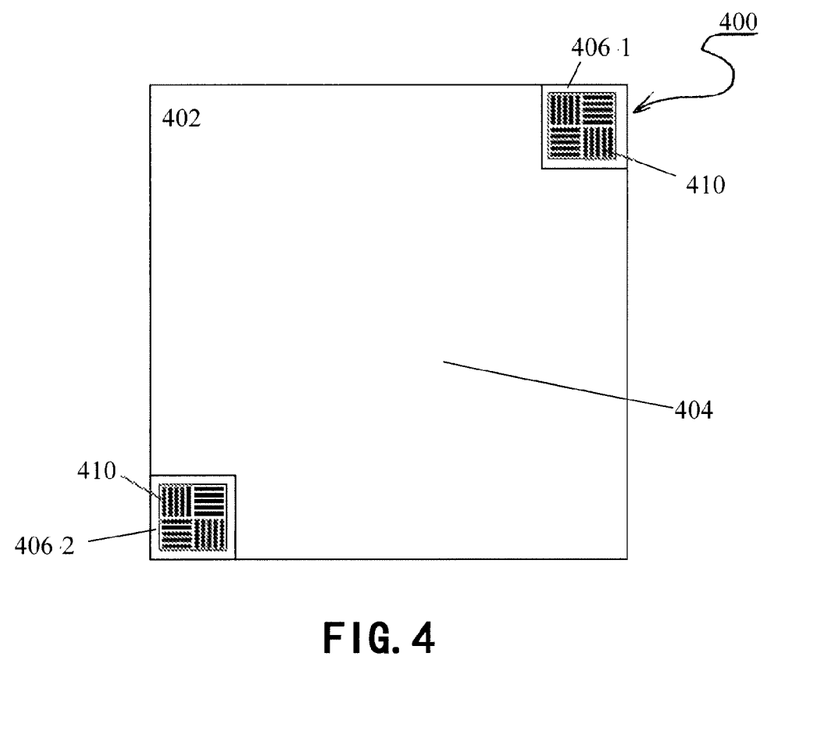
FIG. 4 is a schematic diagram showing a semiconductor wafer layer with alignment marks according to the embodiments of the disclosure.

Note that FIG. 4 only schematically illustrates a semiconductor wafer according to the disclosed embodiments, in which the primary chip region, the mark region and the photolithography alignment marks are not drawn to scale. In fact, the ratio of the sizes of photolithography alignment mark 410 and mark region 406 is far less than that shown herein.

As shown in FIG. 4, in one embodiment, mark region 406 of each wafer layer 402 is located in two corners of the wafer layer. In one embodiment, mark region 406 may be composed of a plurality of mark sub-regions 406 (which can be designated as 1 through j where j is an integer larger than 1), which are distributed preferably in at least two corners of the wafer layer 402, preferably, in at least two diagonal corners. As shown in the example of FIG. 4, mark region 406 is composed of a first mark sub-region 406 1 located in the upper-right corner and a second mark sub-region 406 2 located in the lower-left corner. In other embodiments, first mark sub-region 406 1 and second mark sub-region 406 2 can be located in the lower-right corner and upper-left corner of wafer layer 402, respectively.

As mentioned above, in order to achieve good alignment signal intensity, the photolithography alignment mark can be arranged in mark regions 406 of some or all of the wafer layers 402. Generally, each wafer layer 402 includes one or more metal layers, in which case, the photolithography alignment mark 410 can be formed in the mark regions of some or all of the metal layers.

In addition to the metal layers, the wafer layers 402 generally include an active layer, a poly-Si gate layer, a contact layer and a passivation layer. These layers can also weaken the signal intensity of the alignment mark to a certain extent. In order to obtain more favourable signal intensity, the photolithography alignment mark 410 may be further formed in the mark regions of the active layer, the contact layer, and the passivation layer. In some embodiments, photolithography alignment mark 410 can also be formed in the mark region of the poly-Si gate layer.

When the photolithography alignment mark is formed in multiple wafer layers, in order to prevent mutual alignment signal interference between adjacent mark-disposal layers, the positions of photolithography alignment marks 410 in the mark regions 406 of the different wafer layers 402 are preferably mutually staggered. In one embodiment, photolithography alignment marks in adjacent mark-disposal layers can be staggered from each other by 1 mm. However, when it is needed to provide a large number of wafer layers 402 with photolithography alignment marks 410, large sized mark regions are generally necessary in order to provide suitable separation after the photolithography alignment marks in different layers by a certain distance.

In order to reduce the size of mark regions, "reverse-tone" alignment marks shown in FIG. 2H and "positive-tone" alignment marks shown in FIGS. 2B to 2G can be alternately disposed on layer-by-layer basis in a stacked mark arrangement. For example, if a "positive-tone" alignment mark having fine alignment lines made of a metal and fine alignment line spaces made of an oxide is disposed in a mark-disposal layer, a "reverse-tone" alignment mark having fine alignment lines made of an oxide and fine alignment line spaces made of metal can be disposed in the next mark disposal layer.

In this mark arrangement, the positions of alignment marks in the mark region 406 of each wafer layer 402 can be mutually overlapped, saving the space occupied by the mark region 406 and further improving gross die on the wafer.

A specific example of a semiconductor wafer 500 having the alignment mark of the disclosed embodiments as shown in FIGS. 2A to 2H are described with reference to FIGS. 5A and 5B. The semiconductor wafer 500 shown in FIG. 5A comprises from bottom to top, an active area layer AA 501, a poly-Si gate layer P1 502, a contact layer CT 503, a first metal layer M1 504, a first via layer V1 505, a second metal layer M2 506, a second via layer V2 507, a third metal layer M3 508, a third via layer V3 509, a fourth metal layer M4 510, a fourth via layer V4 511, a fifth metal layer M5 512, a top via layer TV 513, a top metal layer TM 514, a passivation layer PA 515 and an aluminum pad layer ALPAD 516.

As described above, alignment marks can be formed in the metal and passivation layers, which may significantly weaken the alignment mark signal. As shown in FIG. 5A, the alignment marks shown in FIGS. 2A to 2H can be formed in the active area layer AA 501, the contact layer CT 503, the first metal layer M1 504, the fourth metal layer M4 510 and passivation layer PA 515. In other examples, the alignment marks can also be formed in any one or more of poly-Si gate layer P1 502, the second metal layer M2 506, the third metal layer M3 508, the fifth metal layer M5 512 and the top metal layer TM 514.

Figure 5A:
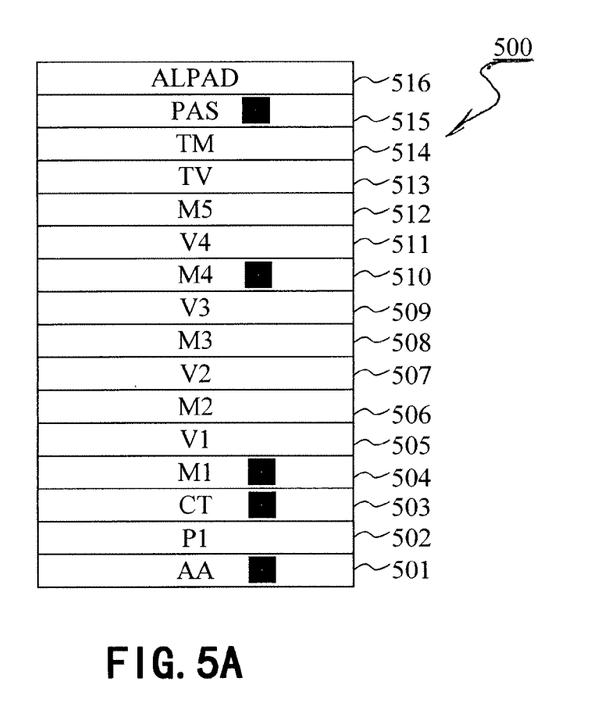
FIG. 5A is a schematic representation of a semiconductor wafer with alignment marks according to an embodiment of the disclosure.
Figure 5B:
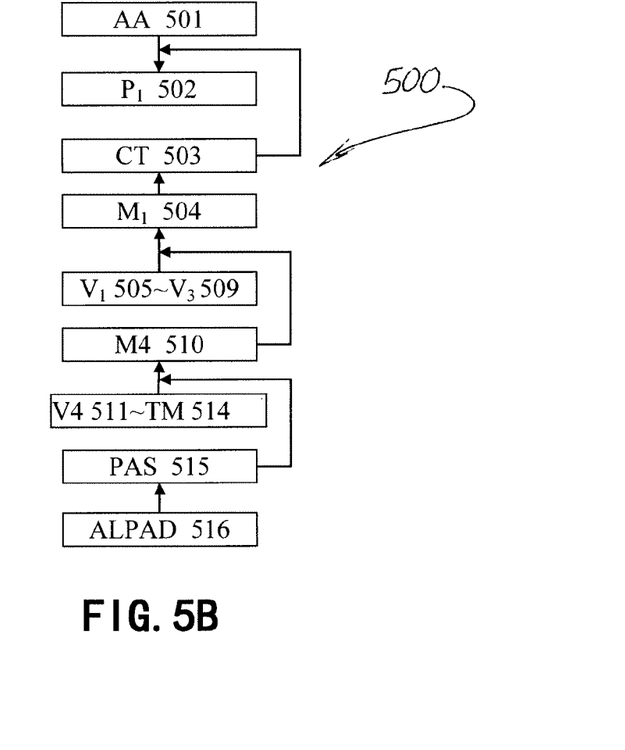
FIG. 5B illustrates a photolithography alignment tree for the semiconductor wafer as shown in FIG. 5A.

FIG. 5B is a photolithography alignment tree for a semiconductor wafer 500 shown in FIG. 5A. As illustrated in FIG. 5B, for FIG. 5A the photolithography alignment mark arrangement is a follows: the alignment marks in the poly-Si gate layer P1 502 and the active area layer AA 501 are aligned with each other; the alignment marks in the contact layer CT 503 and the active area layer AA 501 are aligned with each other; the alignment marks in the first metal layer M1 504 and the contact layer CT 503 are aligned with each other; the alignment marks in each of the first via layer V1 505, second via layer V2 507 and the third via layer V3 509 and first metal layer M1 504 are aligned with each other; the alignment marks in fourth metal layer M4 510 and first metal layer M1 504 are aligned with each other; the alignment marks in fourth via layer V4 511, the fifth metal layer M5 512, the top via layer TV 513, to top metal layer TM 514 and fourth metal layer M4 510 are aligned with each other; the alignment marks in passivation layer PA 515 and fourth metal layer M4 510 are aligned with each other; and the alignment marks in aluminum pad layer ALPAD 516 and passivation layer PA 515 are aligned with each other.

Instead of being formed in the scribe lanes of a wafer as prior art scribe lane alignment marks, the photolithography alignment mark of the disclosed embodiments is formed in a marginal mark region of a pattern layer of a wafer. The photolithography alignment mark of the disclosed embodiments is free from limitation size limits of scribe lanes, and thus can be used in wafers with small sized scribe lanes. Furthermore, the photolithography alignment mark of the disclosed embodiments can be comprised of subdivided lines and formed in a plurality of pre-selected wafer layers, enabling a stronger alignment signal and more accurate alignment.

Furthermore, the photolithography alignment mark of the disclosed embodiments can be arranged in the non-circuit pattern regions of a mask, and in one embodiment can be used solely for processing wafers with small sized scribe lanes, causing no influence on the main processing and no additional mask cost.

The photolithography alignment technique used in semiconductor device manufacturing according to embodiments of the present invention has been described in detail. Some details that are well known in the art are not addressed so as to not obscure the concept of this invention. Based on the above description, those skilled in the art can understand how to implement the technique and solutions disclosed herein.

Although some specific embodiments of the present invention have been demonstrated in detail with examples, is be understood by a person of ordinary skill in the art that the above examples are only intended to be illustrative, and are not intended to limit the scope of the present invention. One skilled in the art will recognize that the above embodiments can be modified without departing from the scope and spirit of the present invention. The scope of the following claims therefore should be accorded the broadest interpretation so as to encompass all such modifications, similar arrangements and procedures.

What is claimed is:

1. A semiconductor wafer, comprising:
a plurality of wafer layers, each of the wafer layers comprising:
a primary wafer region for forming a required circuit pattern; and
a mark region for accommodating one or more photolithography alignment marks,
wherein the photolithography alignment marks comprise:
a plurality of first alignment lines arranged in parallel with each other in a first direction;
a plurality of second alignment lines arranged in parallel with each other in a second direction perpendicular to the first direction,
wherein each first alignment line in the plurality of the first alignment lines is composed of a predetermined number of first fine alignment lines uniformly spaced from each other, and each second alignment line in the plurality of the second alignment lines is composed of the predetermined number of second fine alignment lines uniformly spaced from each other,
wherein the photolithography alignment marks are positioned in the mark regions of one or more selected layers among the plurality of wafer layers.

2. The semiconductor wafer of claim 1, wherein the predetermined number is the same and is 3.

3. The semiconductor wafer according to claim 1, wherein the predetermined number is the same and is 2.

4. The semiconductor according to claim 1, wherein the predetermined number is the same and is 4.

5. The semiconductor wafer according to claim 1, wherein a width of the first fine alignment line is equal to a width of a space between any two adjacent first fine alignment lines, and a width of the second fine alignment line is equal to a width of a space between any two adjacent second fine alignment lines.

6. The semiconductor wafer of claim 5, wherein the width of the first alignment line is 8 μm, and the width of the second alignment line is 8 μm.

7. The semiconductor wafer according to claim 1, wherein the plurality of the first alignment lines are spaced uniformly, and the plurality of second alignment lines are spaced uniformly.

8. The semiconductor wafer of claim 7, wherein the width of the space between any two adjacent first alignment lines is equal to the width of the space between any two adjacent second alignment lines.

9. The semiconductor wafer of claim 8, wherein both of the space between any two adjacent first alignment lines and the space between any two adjacent second alignment lines have a width of 8 μm or 9.6 μm.

10. The semiconductor wafer of claim 7, wherein the space between any two adjacent first alignment lines has a width different from that of the space between any two adjacent second alignment lines.

11. The semiconductor wafer of claim 10, wherein the spaces between a first of either of the adjacent first alignment lines or the second alignment lines has the width of 8 μm and the spaces between the other of the first or second alignment line has a width of 9.6 μm.

12. The semiconductor wafer according to claim 1, wherein the plurality of the first alignment lines is grouped into first and second sets, wherein the first alignment lines in each set are spaced uniformly, and the space between any two adjacent first alignment lines in the first set has a width different from that of the space between any two adjacent first alignment lines in the second set.

13. The semiconductor wafer of claim 12, wherein the spaces between a first of either of the adjacent first alignment lines or the second alignment lines has the width of 8 μm and the spaces between the other of the first or second alignment line has a width of 9.6 μm.

14. The semiconductor wafer according to claim 1, wherein, the plurality of the second alignment lines is grouped into first and second sets, wherein the second alignment lines in each set are spaced uniformly, and the space between any two adjacent second alignment lines in the first set has a width different from that of the space between any two adjacent second alignment lines in the second set.

15. The semiconductor wafer of claim 14, wherein the spaces between a first of either of the adjacent first alignment lines or the second alignment lines has the width of 8 μm and the spaces between the other of the first or second alignment line has a width of 9.6 μm.

16. The semiconductor wafer according to claim 1, wherein the first fine alignment lines and the second fine alignment lines are made of a metal, and the space between any two adjacent first fine alignment lines and the space between any two adjacent second fine alignment lines are made of an oxide, and the space between any two adjacent first alignment lines and the space between any two adjacent second alignment lines is made of an oxide.

17. The semiconductor wafer according to claim 1, wherein the first fine alignment lines and the second fine alignment lines are made of an oxide, and the space between any two adjacent first fine alignment lines and the space between any two adjacent second fine alignment lines are made of a metal, and the space between any two adjacent first alignment lines and the space between any two adjacent second alignment lines is made of metal.

18. The semiconductor wafer of claim 1, wherein the mark region is located in one or more corners of the wafer layer.

19. The semiconductor wafer of claim 18, wherein the mark region comprises a plurality of mark sub-regions, each of which can receive one or more said photolithography alignment marks, at least two corners of the wafer layer each having a mark sub-region provided therein.

20. The semiconductor wafer of claim 19, wherein the mark region comprises a first mark sub-region and a second mark sub-region, the first mark sub-region and the second mark sub-region located in a lower-left corner and a upper-right corner of the wafer layer, respectively.

21. The semiconductor wafer of claim 19, wherein the mark region comprises a first mark sub-region and a second mark sub-region, the first mark sub-region and the second mark sub-region located in a lower-right corner and a upper-left corner of the wafer layer, respectively.

22. The semiconductor wafer of claim 1, wherein the plurality of wafer layers comprise one or more metal layers, and the photolithography alignment mark is formed in one or more of the mark regions of the one or more metal layers.

23. The semiconductor wafer of claim 22, wherein the plurality of wafer layers further comprise an active area layer, a poly-Si gate layer, a contact layer and a passivation layer, the photolithography alignment marks being formed in the mark regions of the active area layer, the contact layer and the passivation layer.

24. The semiconductor wafer of claim 23, wherein the photolithography alignment mark is also formed in the mark region of the poly-Si gate layer.

25. The semiconductor wafer according to claim 1, wherein the photolithography alignment marks in the mark regions of the selected of the plurality of layers are staggered.

26. The semiconductor wafer of claim 25, wherein the positions of the photolithography alignment marks in adjacent selected layers are separated by 1mm.

27. The semiconductor wafer of claim 1, wherein the plurality of wafer layers first photolithography alignment marks and the second photolithography alignment marks which alternate, on a layer-by-layer basis, are formed in the mark regions of the selected layers, and the positions of the photolithography alignment marks in the mark regions of the different selected layers are overlapped.

28. The semiconductor wafer of claim 27 wherein the first photolithographic alignment marks comprise first fine alignment lines and second fine alignment lines made of a metal, and spaces between any two adjacent first fine alignment lines and spaces between any two adjacent second fine alignment lines are made of an oxide, and spaces between any two adjacent first alignment lines and spaces between any two adjacent second alignment lines are made of an oxide and wherein the second photolithographic alignment marks comprise first fine alignment lines and the second fine alignment lines made of an oxide, and spaces between any two adjacent first fine alignment lines and spaces between any two adjacent second fine alignment lines are made of a metal, and spaces between any two adjacent first alignment lines and spaces between any two adjacent second alignment lines are made of a metal.

29. A semiconductor wafer, comprising from bottom to top:
   an active area layer; a poly-Si gate layer; a contact layer; a first metal layer; a first via layer; a second metal layer; a second via layer; a third metal layer; a third via layer; a fourth metal layer; a fourth via layer; a fifth metal layer; a top via layer; a top metal layer; a passivation layer; and an aluminium pad layer,
   wherein one or more photolithography alignment marks are formed in the active area layer, the contact layer, the first metal layer, the fourth metal layer and the passivation layer,
   the photolithography alignment marks comprising:
      a plurality of first alignment lines arranged in parallel with each other in a first direction;
      a plurality of second alignment lines arranged in parallel with each other in a second direction perpendicular to the first direction,
   wherein each first alignment line in the plurality of the first alignment lines is composed of a predetermined number of first fine alignment lines uniformly spaced from each other, and each second alignment line in the plurality of the second alignment lines is composed of the predetermined number of second fine alignment lines uniformly spaced from each other.

30. The semiconductor wafer of claim 29, wherein the photolithography alignment marks are also formed in any one or more of the poly-Si gate layer, the second metal layer, the third metal layer and the fifth metal layer and the top metal layer.

* * * * *